United States Patent
Iwata et al.

(10) Patent No.: US 6,770,913 B2
(45) Date of Patent: Aug. 3, 2004

(54) ZNOSSE COMPOUND SEMICONDUCTOR, INTEGRATED CIRCUIT USING THE SEMICONDUCTOR AND METHOD OF MANUFACTURING THE SEMICONDUCTOR AND THE INTEGRATED CIRCUIT

(75) Inventors: Kakuya Iwata, Tsukuba (JP); Shigeru Niki, Tsukuba (JP); Paul Fons, Tsukuba (JP); Akimasa Yamada, Tsukuba (JP); Koji Matsubara, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 65 days.

(21) Appl. No.: 10/234,160

(22) Filed: Sep. 5, 2002

(65) Prior Publication Data

US 2003/0042851 A1 Mar. 6, 2003

(30) Foreign Application Priority Data

Sep. 5, 2001 (JP) .................................... 2001-269497

(51) Int. Cl.$^7$ .............................................. H01L 33/00
(52) U.S. Cl. ............................................ 257/79; 257/11
(58) Field of Search ................................ 257/79, 9, 11, 257/190, 200, 201, 627; 438/48

(56) References Cited

U.S. PATENT DOCUMENTS 6,376,866 B1 * 4/2002 Shakuda ..................... 257/103
6,392,257 B1 * 5/2002 Ramdani et al. ............ 257/190

FOREIGN PATENT DOCUMENTS

JP          9-219563        8/1997

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

A light-emitting device includes a silicon substrate, a ZnOSSe layer provided on the silicon substrate that is lattice-matched to the silicon substrate, and a separate confinement heterostructure light-emitting layer that is provided on the ZnOSSe layer and includes an active layer and upper and lower clad layers.

10 Claims, 7 Drawing Sheets

ZNOSSE COMPOUND SEMICONDUCTOR, INTEGRATED CIRCUIT USING THE SEMICONDUCTOR AND METHOD OF MANUFACTURING THE SEMICONDUCTOR AND THE INTEGRATED CIRCUIT

BACKGROUND OF THE INVENTION

1. Field of the Invention

The present invention relates to a zinc oxide sulfide selenide (hereinafter referred to as ZnOSSe) compound semiconductor, to an integrated circuit having the ZnOSSe compound semiconductor mounted thereon and to a method of manufacturing the same. More particularly, the present invention relates to a light-emitting device, a switching device and an integrated circuit that use a silicon substrate that utilizes lattice matching of the ZnOSSe compound semiconductor and a Si semiconductor, and to a method of manufacturing these devices.

2. Description of the Prior Art

Considerable research has been conducted into growing GaAs on silicon substrates. However, even if AlGaAs should be used as the GaAs-based optical semiconductor, in terms of the principle at work, it is not possible to fabricate a light-emitting device having a wavelength shorter than that of red light. JP-A HEI 9-219563 describes an invention that successfully accomplishes lattice matching with the GaAs substrate by utilizing a large bandgap bowing parameter. GaInNAs and InNPAs have a large bandgap bowing parameter, which the invention applies to a mid-infrared light-emitting device. However, because it is a group III–V semiconductor that is being used, it is not possible to manufacture a light-emitting device that covers the visible-light spectrum.

It has been considered that the only semiconductors having a lattice that matches silicon are GaP, AlP and ultraviolet-region ZnS, which are indirect transition type semiconductors not suitable for optical applications.

An object of the present invention is to provide a light-emitting device that provides lattice matching with silicon and can provide a wide range of emission wavelengths, from infrared and visible light to ultraviolet, an integrated circuit using the device, and a method of manufacturing the same.

Another object is to provide a switching device that is lattice-matched to the silicon substrate and only operates when it receives light within a set wavelength that includes infrared, visible and ultraviolet light.

SUMMARY OF THE INVENTION

To attain the above object, the present invention provides a light-emitting device comprising: a silicon substrate, a ZnOSSe layer bonded to the silicon substrate that is lattice-matched to the silicon substrate, and a separate confinement heterostructure (SCH) light-emitting layer that is provided on the ZnOSSe layer and comprises an active layer, a lower clad layer and an upper clad layer. The SCH light-emitting layer of the light-emitting device can have the active layer formed of ZnOSSe and the upper and lower clad layers formed of ZnMgOSSe.

The above object is also attained by a switching device comprising: a silicon substrate, a ZnOSSe layer bonded to the silicon substrate that is lattice-matched to the silicon substrate, and an electrode provided on the upper surface of the ZnOSSe layer.

The above object is also attained by an integrated circuit comprising: a silicon substrate, a ZnOSSe layer provided on the silicon substrate that is lattice-matched to the silicon substrate, and an SCH light-emitting layer that is provided on the ZnOSSe layer and comprises an active layer, a lower clad layer and an upper clad layer. The SCH light-emitting layer of the integrated circuit can have the active layer formed of ZnOSSe and the upper and lower clad layers formed of ZnMgOSSe.

The above object is also attained by a method of manufacturing a light-emitting device, comprising: forming a lattice-matched ZnOSSe layer on a silicon substrate under an ultrahigh vacuum while adjusting a composition ratio of the oxygen, selenium and sulfur of the ZnOSSe layer to change a device emission wavelength within a range that includes infrared, visible and ultraviolet light without lattice mismatch; and forming on the ZnOSSe layer a light-emitting layer that comprises an active layer, a lower clad layer and an upper clad layer. A molecular beam epitaxy (MBE) method can be used to form the ZnOSSe layer on the silicon substrate. The light-emitting layer can have the active layer formed of ZnOSSe and the upper and lower clad layers formed of ZnMgOSSe while controlling the composition ratio of the zinc, magnesium, oxygen and sulfur of the ZnMgOSSe upper and lower clad layers to lower the threshold current.

The above object is also attained by a method of manufacturing an integrated circuit, comprising: forming a lattice-matched ZnOSSe layer on a silicon substrate under an ultrahigh vacuum while adjusting a composition ratio of the oxygen, selenium and sulfur of the ZnOSSe layer to change a device emission wavelength within the infrared range without lattice mismatch; and forming on the ZnOSSe layer a light-emitting layer that comprises an active layer, a lower clad layer and an upper clad layer. An MBE method can be used to form the ZnOSSe layer on the silicon substrate.

As described in the foregoing, the ZnOSSe layer of the present invention can be lattice-matched to the silicon substrate, enabling it to be formed on a silicon substrate together with a conventional semiconductor device to thereby constitute an integrated circuit. Also, by modifying the component ratios of the oxygen, selenium and sulfur of the ZnOSSe layer, the device emission wavelength can be changed within a range that includes infrared, visible and ultraviolet light.

Further features of the invention, its nature and various advantages will be more apparent from the accompanying drawings and following detailed description of the invention.

DESCRIPTION OF THE PREFERRED EMBODIMENT

Figure 2:
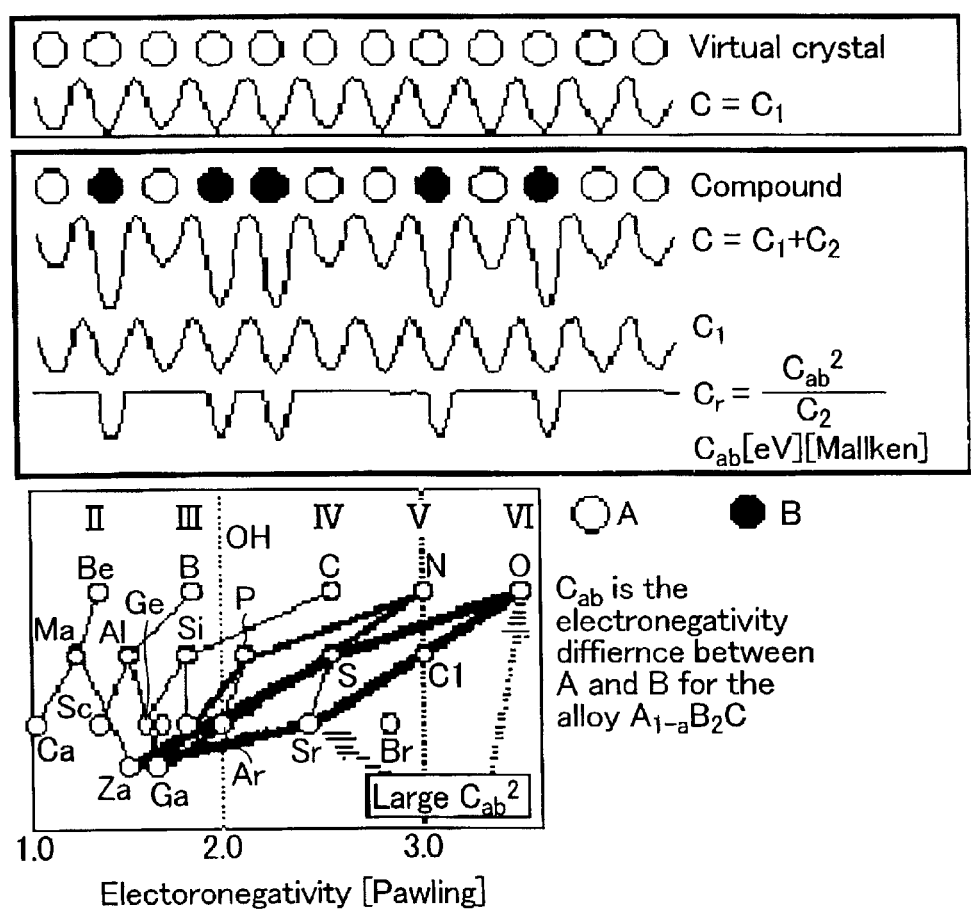
FIG. 2 illustrates the bandgap bowing parameter and the theoretical predicted values for ZnOSSe.

The semiconductor bandgap bowing phenomenon that became a starting point for the present invention is derived from a principle set out by J. A. Van Vechten et al. in 1970. The energy gap of a compound semiconductor can be expressed as $$Eg(x)=c(x-1)x+(EgZnSe-EgZnO)x+EgZnO \quad (1)$$

where c is the bowing parameter. The bowing parameter c is expressed as the sum of the ideal crystal term ci and the term ce based on added elements, as in FIG. 2. The gap between the added and original elements is manifested as the square of the electronegativity difference between the elements. In the case of the compound systems ZnOSe and ZnOS, there is a large electronegativity difference between the oxygen and the selenium and between the oxygen and the sulfur, so it can be predicted that there will be a large bandgap bowing phenomenon.

Figure 1:
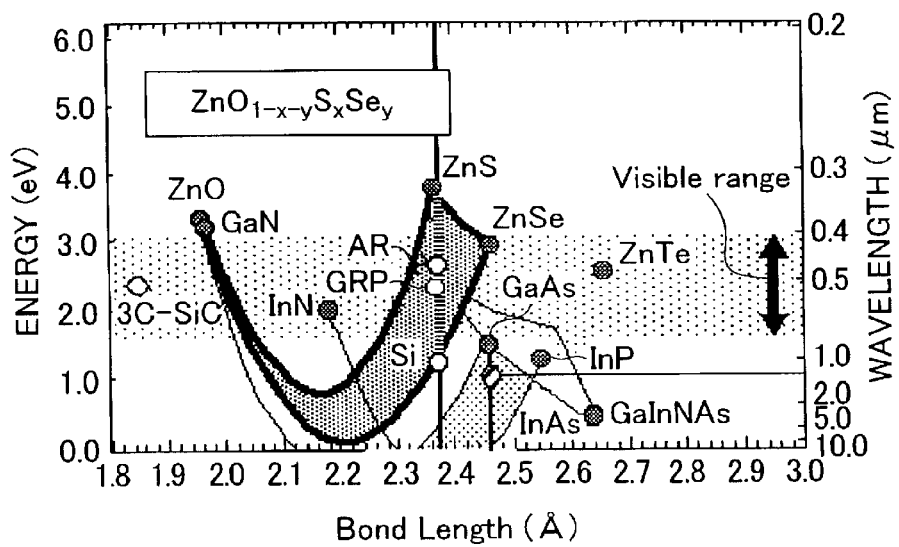
FIG. 1 shows the relationship between bandgap energy and atomic bond length with respect to the composition of ZnOSSe that is lattice-matched to silicon.
Figure 3:
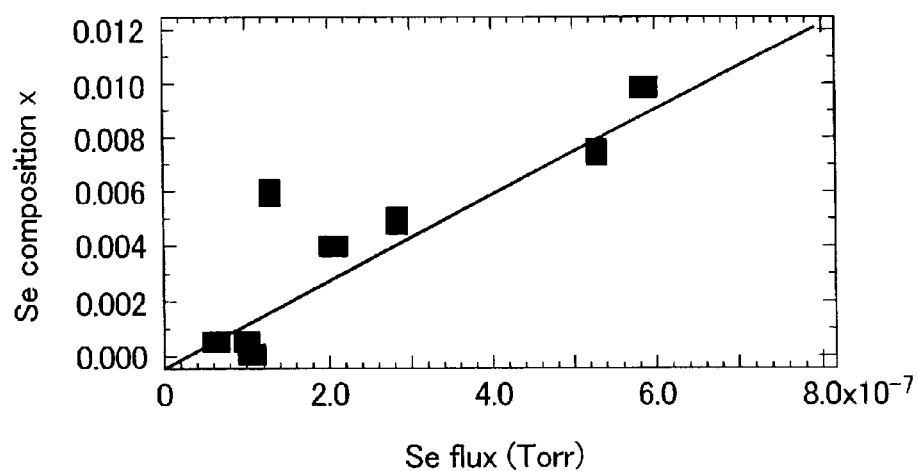
FIG. 3 shows the ZnOSe selenium composition dependence on the selenium supply flux.

Based on that prediction, the present inventors carried out further studies, resulting in the discovery of major bandgap bowing between ZnO and ZnSe and between ZnO and ZnS, as shown in FIG. 1. This discovery enabled the invention to be accomplished. That is, lattice-matching ZnOSSe compound semiconductor to the silicon substrate and the change of composition ratios of the oxygen, sulfur and selenium of the ZnOSSe compound semiconductor makes it possible to form a device having an emission wavelength that can be freely changed from infrared and visible light ranges to ultraviolet, as shown in FIG. 1. FIG. 3 shows the selenium composition dependence on the selenium supply flux when fabricating the ZnOSe compound semiconductor on which the present invention is based. From FIG. 3, it can be understood that increasing the selenium supply flux increases the selenium content of the ZnOSe.

Figure 4:
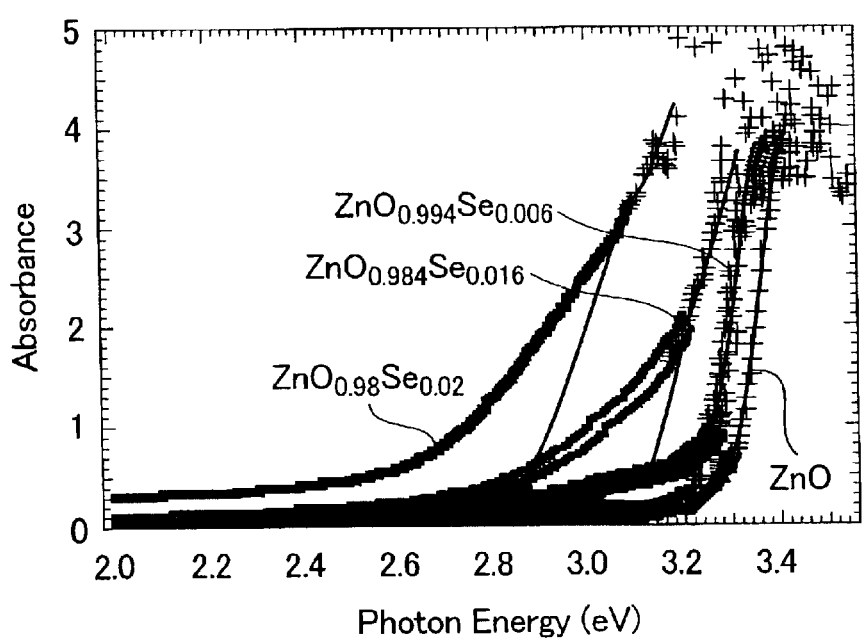
FIG. 4 shows the absorbance characteristics obtained when the ZnOSe bandgap is decreased.

In order to check whether bandgap bowing was really occurring in actually fabricated ZnOSe compound semiconductor, the optical absorbance was measured to measure bandgap changes. FIG. 4 shows the optical absorbancy characteristics of the ZnOSe. This shows that an increase in the selenium content of the ZnOSe is accompanied by an absorbancy shift toward the low energy side. The extent of the bandgap bowing can be ascertained by calculating the relationship between the shift amount $\Delta Eg$ and the selenium content.

Figure 5:
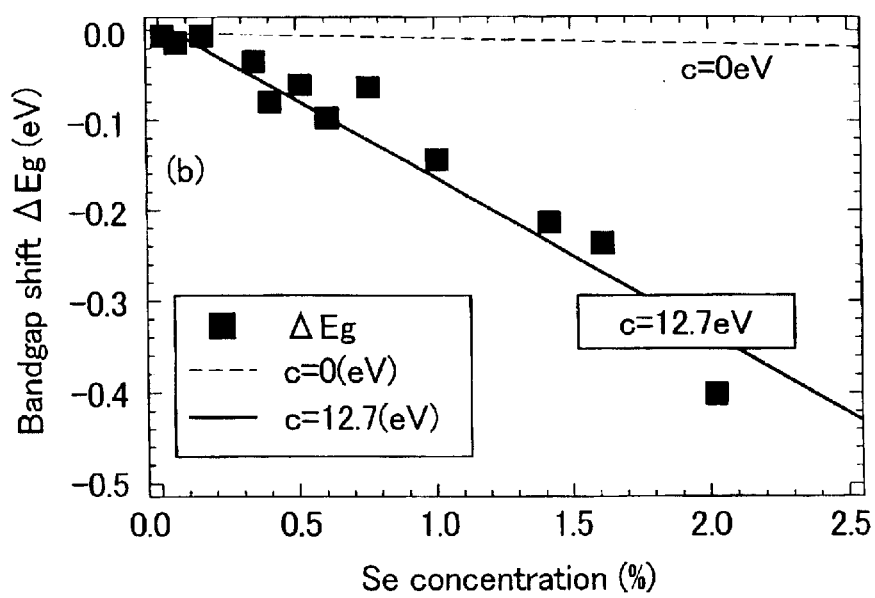
FIG. 5 shows the bandgap energy shift $\Delta E_g$ as a function of selenium content.

FIG. 5 shows the relationship between the bandgap energy shift $\Delta Eg$ and the selenium content of the fabricated ZnOSe. Fitting these measured values to the quadric function of equation (1) enabled the bowing parameter to be calculated as 12.7 eV. This is a high value that currently is second only to the 18 eV of GaNAs, which is known for its high bowing parameter.

A semiconductor laser for communication applications having an operating wavelength of 1.3 $\mu$m has been produced by using the large bowing parameter of GaNAs, in the form of GaInNAs, to effect lattice matching. This is a good example of the ability to utilize a large bowing parameter to induce large bandgap changes with a small change in the lattice constant. Based on this, it was discovered that ZnOSe also could be lattice-matched to silicon by increasing the sulfur content. ZnOSSe could also be lattice-matched to substrate silicon by increasing the oxygen content of the ZnOSSe.

FIG. 1 shows the component ranges of ZnOSSe lattice-matched to silicon. From this, it can be understood that the bandgap can be changed from infrared and visible light to ultraviolet by matching the lattice to the silicon while changing the composition ratios of the oxygen, selenium and sulfur. In the case of a ZnOSSe light-emitting device, what this signifies is that it is possible to change the emission wavelength from infrared and visible light to ultraviolet by changing the composition ratios of the oxygen, selenium and sulfur components.

This shows that the ZnOSSe semiconductor of the present invention has the following two features: (1) a large bowing parameter that makes it possible to induce large bandgap changes with a small change in the lattice constant; and (2) a silicon-lattice-matching composition component ratio that induces a large bandgap change, from infrared and visible light to ultraviolet.

Figure 6:
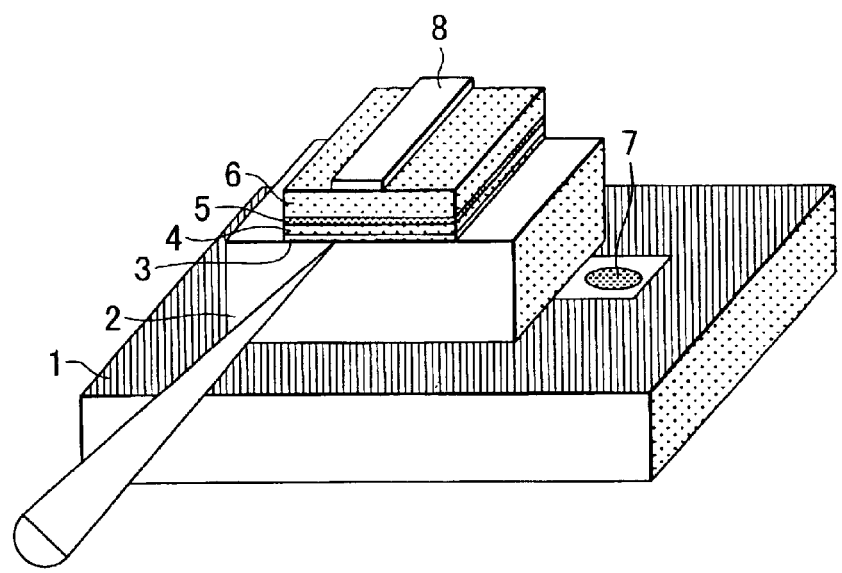
FIG. 6 shows an example of a ZnOSSe/Si heterojunction-type semiconductor laser according to the present invention.

An example of a semiconductor light-emitting device according to the present invention will now be described with reference to FIG. 6. An n-type ZnOSSe layer 2 was formed on a silicon substrate 1 with the ZnOSSe lattice-matched to the silicon. An emission layer having a separate confinement heterostructure (SCH) was then formed on the n-type ZnOSSe layer 2, with the SCH comprising a ZnOSSe active layer 4, an n-type ZnMgOSSe lower clad layer 3 and a p-type ZnMgOSSe upper clad layer 5. This was followed by the formation of a p-type ZnOSSe cap layer 6 and a negative electrode 8. A positive electrode 7 was connected to the n-type ZnOSSe layer 2.

As an example of a method of fabricating the light-emitting device, the multilayer ZnOSSe structure comprising the n-type ZnOSSe layer 2, n-type ZnMgOSSe lower clad layer 3, ZnOSSe active layer 4, p-type ZnMgOSSe upper clad layer 5 and p-type ZnOSSe cap layer 6 was formed on the silicon substrate in an ultrahigh vacuum by the MBE method. A Knudsen cell was used to supply the zinc. Oxygen was added by using a plasma cell, with RF plasma power being used to control the flow rate of the oxygen gas. A valve cracker cell was used to control the sulfur and selenium supply flux, thereby controlling the ratios of composition components. FIG. 3 shows the relationship between the actual selenium flux and the selenium content of the ZnOSe compound semiconductor.

In addition to making it possible to change the laser emission wavelength from infrared and visible light to ultraviolet by adjusting the content ratios of the oxygen, selenium and sulfur in the n-type ZnOSSe layer 2 lattice-matched to the silicon substrate 1, the above method of fabricating the light-emitting device also makes it possible to introduce strain into the active layer by its ability to effect fine control of the content ratios of the zinc, magnesium, oxygen, selenium and sulfur in the upper and lower clad layers 5 and 3. This enables the realization of a semiconductor laser with a low threshold current to be expected.

Figure 7:
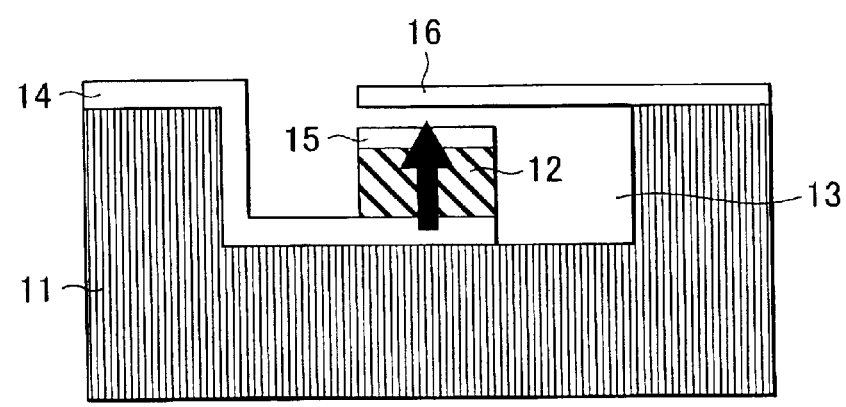
FIG. 7 shows an example of a ZnOSSe/Si heterojunction-type switching device according to the present invention.

FIG. 7 shows an example of a ZnOSSe semiconductor switching device according to the present invention, fabricated with a ZnOSSe layer 12 lattice-matched to the silicon substrate 11, with the ZnOSSe layer 12 being formed in a recessed portion 13 formed in the top face of the substrate. A positive electrode 14 is provided between the silicon substrate 11 and the ZnOSSe layer 12, and a negative electrode 15 is formed on the upper part of the ZnOSSe layer 12.

When an electrical field is applied perpendicularly to the silicon substrate 11 on which a c-axis-oriented ZnOSSe layer has been thus formed, non-polar silicon is not deformed by the piezo effect but the ZnOSSe layer 12 is, producing contact between the electrodes 15 and 16, which increases the insulation resistance and enables the realization of a nanometric-scale switching device. By utilizing lattice-matching to the silicon, the switching device of FIG. 7 can be mounted on a silicon integrated circuit and can be used as an optical switching device with switching characteristics that change depending on the wavelength of the light concerned. That is, the range can be selectively set from infrared and visible light to ultraviolet by changing the content ratios of the oxygen, selenium and sulfur components of the ZnOSSe layer 12, so that the device only functions when it receives light that is within the set wavelength region. The method of manufacturing the switching device and controlling the oxygen, selenium and sulfur content ratios is based on the method of manufacturing the light-emitting device described above.

Using the ZnOSSe compound semiconductor of the present invention makes it possible to change the emission wavelength over a wide range that extends from infrared and visible light to ultraviolet light regions, simply by changing the mixture ratios of the oxygen, sulfur and selenium. Moreover, the ability to effect lattice-matching with the silicon substrate makes it possible to use it to fabricate optical devices capable of display, optical transmission and optical information processing on a silicon integrated circuit.

Figure 8:
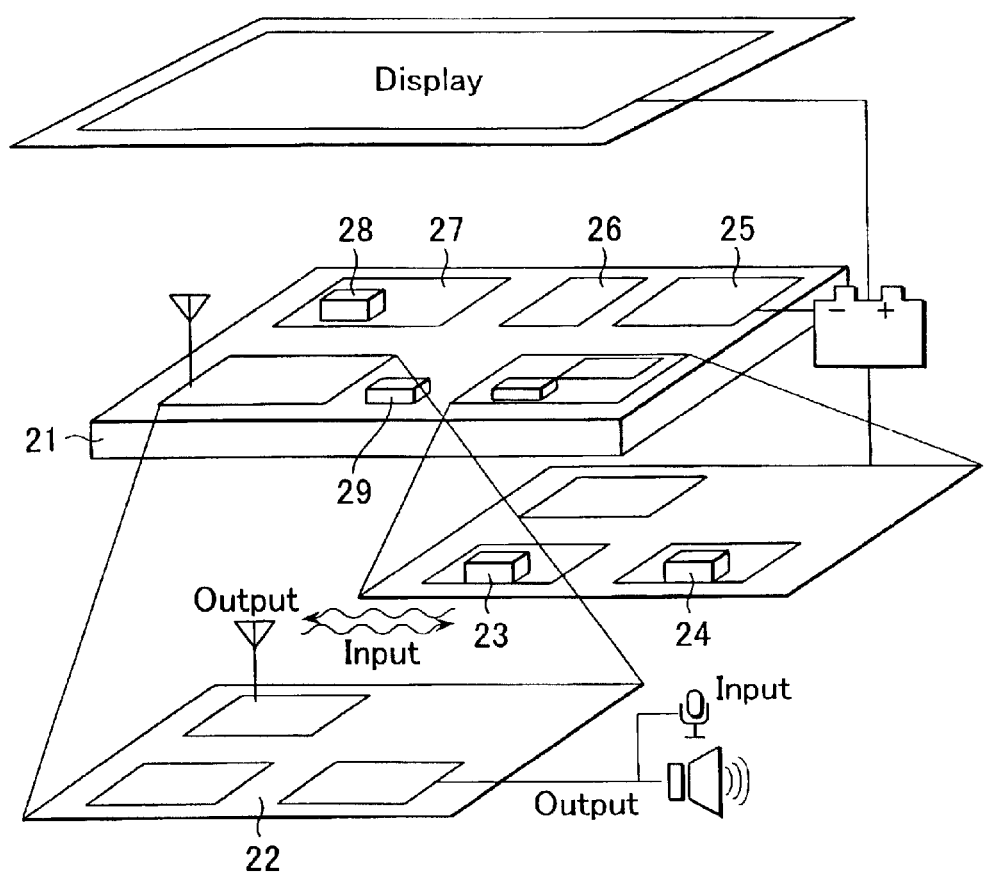
FIG. 8 shows an example of a ZnOSSe/Si heterojunction-type integrated circuit according to the present invention.

FIG. 8 shows an example of an integrated circuit comprising a group of ZnOSSe semiconductor elements mounted on a silicon substrate. The integrated circuit comprises a SAW device 22 that includes input and output functions and a SAW oscillator, a ZnOSSe laser diode 23, a ZnOSSe photodetector 24, a ZnO FET 25, a ferroelectric memory 26, a microprocessor 27, a ZnOSSe SAW oscillator 28 and a SAW filter 29 that are mounted on a silicon substrate 21, to form an opto-electronic device. The method of manufacturing the integrated circuit is based on the method of manufacturing the light-emitting device described in the foregoing.

Thus, as described in the foregoing, the ZnOSSe semiconductor of the present invention can be lattice-matched to the silicon substrate and can therefore be provided on a silicon substrate together with conventional semiconductor device elements, making it possible to form wavelength multiplexing communication devices having a wide wavelength capability that ranges from infrared and visible light to ultraviolet light. This can be expected to facilitate a major downsizing of information terminals based on the convergence of information-processing and communication integrated circuits with display devices.

What is claimed is:

1. A light-emitting device comprising: a silicon substrate; a ZnOSSe layer bonded to the silicon substrate that is lattice-matched to the silicon substrate; and a separate confinement heterostructure (SCH) light-emitting layer that is provided on the ZnOSSe layer and comprises an active layer, a lower clad layer and an upper clad layer.

2. The light-emitting device according to claim 1, wherein the SCH light-emitting layer has the active layer formed of ZnOSSe and the upper and lower clad layers formed of ZnMgOSSe.

3. A switching device comprising: a silicon substrate; a ZnOSSe layer bonded to the silicon substrate that is lattice-matched to the silicon substrate; and an electrode provided on an upper surface of the ZnOSSe layer.

4. An integrated circuit comprising: a silicon substrate; a ZnOSSe layer provided on the silicon substrate that is lattice-matched to the silicon substrate; and a separate confinement heterostructure (SCH) light-emitting layer that is provided on the ZnOSSe layer and comprises an active layer, a lower clad layer and an upper clad layer.

5. The integrated circuit according to claim 4, wherein the SCH light-emitting layer has the active layer formed of ZnOSSe and the upper and lower clad layers formed of ZnMgOSSe.

6. A method of manufacturing a light-emitting device, comprising: forming a lattice-matched ZnOSSe layer on a silicon substrate under an ultrahigh vacuum while adjusting a composition ratio of the oxygen, selenium and sulfur of the ZnOSSe layer to change a device emission wavelength within a range that includes infrared, visible and ultraviolet light without lattice mismatch; and forming on the ZnOSSe layer a light-emitting layer that comprises an active layer, a lower clad layer and an upper clad layer.

7. The method of manufacturing a light-emitting device according to claim 6, wherein the ZnOSSe layer is formed on the silicon substrate through a molecular beam epitaxy method.

8. The method of manufacturing a light-emitting device according to claim 6, wherein the light-emitting layer has the active layer formed of ZnOSSe and the upper and lower clad layers formed of ZnMgOSSe while controlling a composition ratio of the zinc, magnesium, oxygen and sulfur of the upper and lower clad layers to lower a threshold current.

9. A method of manufacturing an integrated circuit, comprising: forming a lattice-matched ZnOSSe layer on a silicon substrate under an ultrahigh vacuum while adjusting a composition ratio of the oxygen, selenium and sulfur of the ZnOSSe layer to change a device emission wavelength within an infrared range; and forming a light-emitting layer on the ZnOSSe layer.

10. The method of manufacturing an integrated circuit according to claim 9, wherein the ZnOSSe layer is formed on the silicon substrate through a molecular beam epitaxy method.

* * * * *